United States Patent [19]

Sakai

[11] Patent Number: 4,700,057

[45] Date of Patent: Oct. 13, 1987

[54] LIGHT SOURCE WITH POWER STABILIZER HAVING TEMPERATURE COMPENSATION

[75] Inventor: Mitsugu Sakai, Hachioji, Japan

[73] Assignee: Olympus Optical Company Limited, Tokyo, Japan

[21] Appl. No.: 785,910

[22] Filed: Oct. 9, 1985

[30] Foreign Application Priority Data

Oct. 9, 1984 [JP] Japan .............................. 59-212358

[51] Int. Cl.$^4$ ............................................... G01J 1/32
[52] U.S. Cl. ..................................... 250/205; 250/238
[58] Field of Search .................. 250/205, 214 C, 238; 455/618; 372/34

[56] References Cited

U.S. PATENT DOCUMENTS

| | | | |
|---|---|---|---|
| 3,872,301 | 3/1975 | Joppich | 250/214 C |
| 4,025,440 | 5/1977 | Suga | 250/214 C |
| 4,307,469 | 12/1981 | Casper et al. | 455/608 X |
| 4,369,525 | 1/1983 | Breton et al. | 372/31 X |
| 4,537,510 | 8/1985 | Takahasi | 250/565 |

Primary Examiner—Eugene R. LaRoche
Assistant Examiner—David Mis
Attorney, Agent, or Firm—Robert E. Burns; Emmanuel J. Lobato

[57] ABSTRACT

An optical power stabilizing device for use in an optical information recording and reproducing apparatus is disclosed. The device comprises a light source for generating a light output power having a non-linear characteristic to a driving current or voltage thereof, a light detection circuit coupled to the light source for detecting a part of the output light to generate an electric signal, a signal treating circuit connected to the light detection circuit for treating the detected electric signal, a compension circuit connected to the signal treating circuit for compensating the current or voltage to be supplied to the light source in accordance with the temperature variation, and a control circuit connected to the signal treating circuit and the compensation circuit for controlling the current or voltage to be supplied to the light source.

6 Claims, 4 Drawing Figures

PRIOR ART FIG. 2
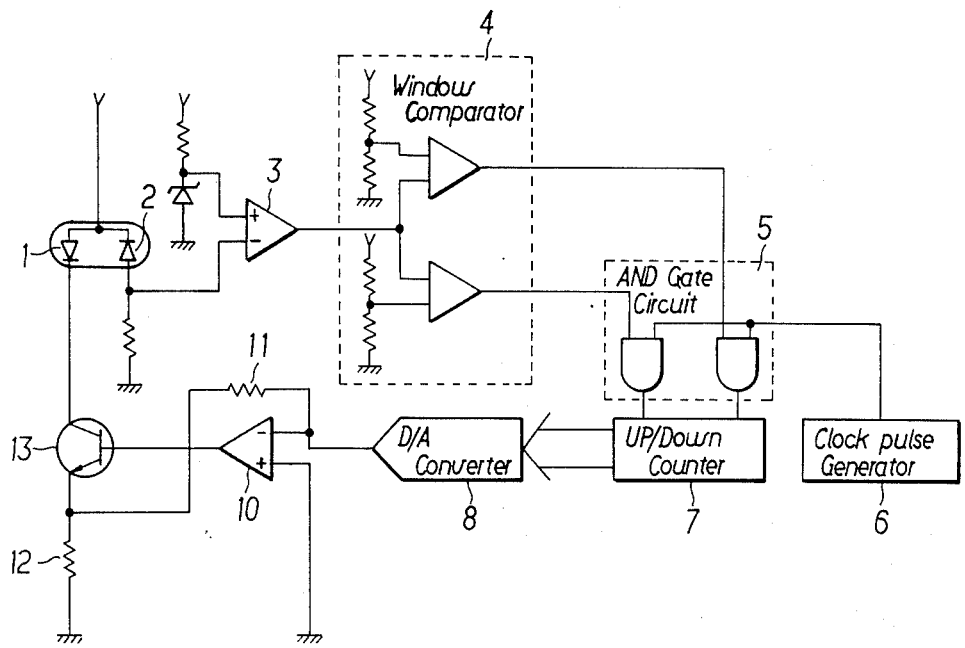
FIG. 4
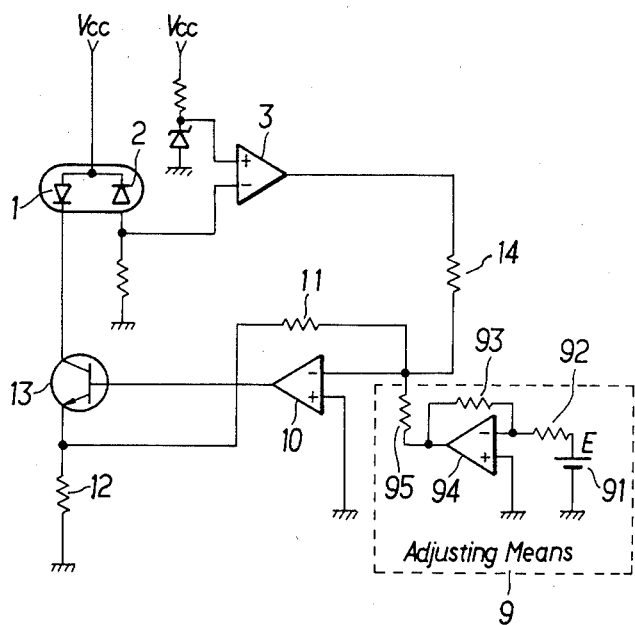

F I G. 3
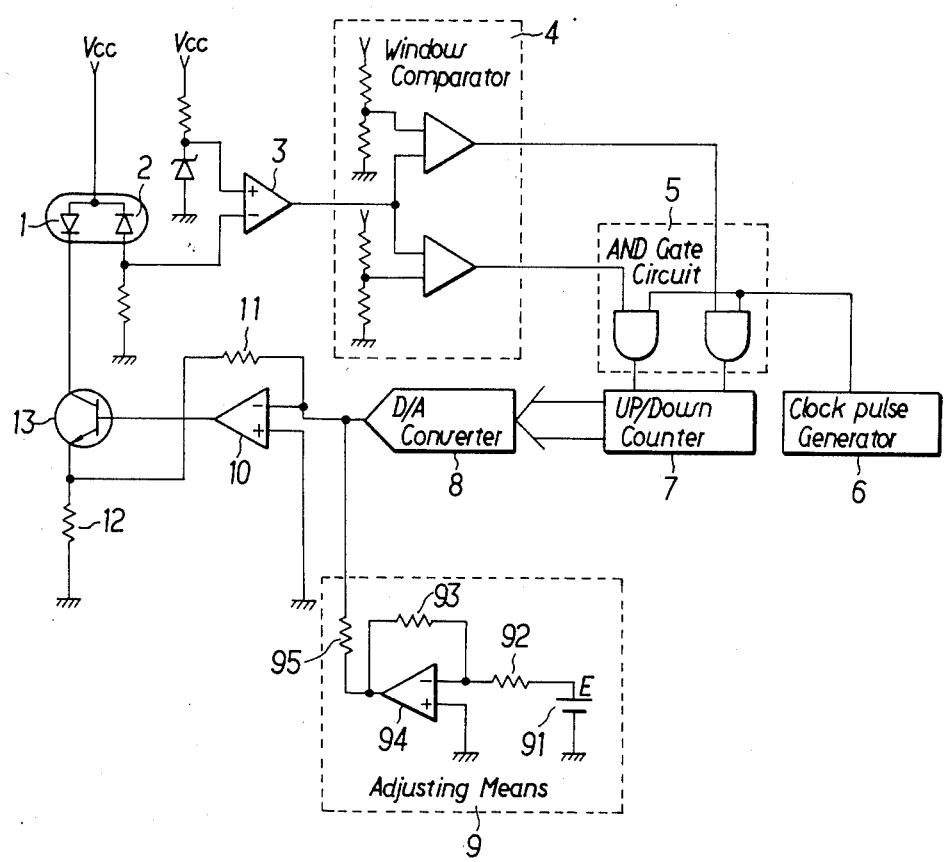

LIGHT SOURCE WITH POWER STABILIZER HAVING TEMPERATURE COMPENSATION

BACKGROUND OF THE INVENTION

The present invention relates to an optical output stabilizing device for generating a stabilized light output power from a light source, such as a semiconductor device, a discharge tube or the like, having a non-linear light power characteristic with respect to a drive current (voltage), by means of automatically controlling the quantity of light output power to a desired level.

The light source such as a semiconductor device, a discharge tube or the like has a non-linear light power characteristics with respect to the drive current (voltage) for the light source. The non-linear characteristics of the light output power is to be understood to mean a curved line characteristics which show zero or very weak light output power at very small drive current (voltage) and an abruptly increased light output power as the drive current (voltage) is increased. In order to obtain stabilized light output power from the light source having such a non-linear characteristics of the light output power, it is necessary to perform the stabilization of the light output power by controlling the drive current (voltage) suitably before and after a knee point of the curved line. As a typical light source having the non-linear characteristic of the light output power, a semiconductor laser element is described by way of example with reference to the drawings, corresponding elements having been given the same reference numerals.

As shown in FIG. 1, the semiconductor laser element exhibits a non-linear characteristic of the light output power having a curved line portion with respect to a drive current 1. The knee point is, generally, defined by a threshold current $I_{th}$ and the slope of a steep rising portion after the knee point is defined by a differential quantum efficiency $\eta$. The light power characteristics of such a semiconductor laser element exhibits an increase of the threshold current $I_{th}$ and a decrease of the differential quantum efficiency $\eta$ due to an increase in ambient temperature of the laser element or deterioration of the element. Such a variation of the light power characteristic is shown in FIG. 1 by $C_1$ and $C_2$. The effect of the temperature dependency or the deterioration dependency on such a light power characteristic is remarkable when the semiconductor laser element is driven by a pulse current to obtain a pulsatory light power. FIG. 1 also shows such an effect by light powers $P_1$ and $P_2$. This is the case that the semiconductor laser element is used as a light source of an optical memory device, the readout of the stored information is performed by a weak continuous oscillation mode of the laser element caused by a DC current $I_R$, and the writing or erasing of information is performed by a strong pulse oscillation mode caused by a pulse current $I_W$. As is seen from FIG. 1, when the light power characteristic is changed from $C_1$ to $C_2$ due to the deterioration or temperature rise of the laser element, the continuous oscillation mode (output component corresponding to the DC current $I_R$) for readout can not often be obtained.

FIG. 2 shows a typical conventional light power stabilizing device for obtaining a stabilized light output power from a light source having non-linear characteristic (also called as Automatic Power Controller). As seen from FIG. 2, a part of light power generated by a semiconductor laser element 1 is detected by a photo detector 2. The output of the detector 2 is supplied through an amplifier 3 to a window comparator 4 which compares the input signal with previously set upper and lower levels to generate output signals having inverse polarity. These output signals are supplied to first input of an AND gate circuit 5 which receives at its second input clock signals of a clock pulse generator 6 and supplies its output to a digital up/down counter 7. The output of the counter 7 is supplied through a D/A converter 8 to an perational amplifier 10 having a feedback resistor 11. The output of the amplifier 10 is supplied to a base of a transistor 13 serving as a control means for the element 1 with a series resistor 12, thereby feedback-controlling the device current of the semiconductor laser element 1. In such conventional light power stabilizing device, the control of driving current over whole setting range of the laser element is performed by the window comparator 4, the up/down counter 7 and the D/A converter 8, so that the control precision is limited by the dead zone and the response speed of respective components and the bit number. As shown in FIG. 1, for example, when the semiconductor laser element is oscillated at the pulse oscillation mode (corresponding to $I_W$ component) together with the continuous oscillation mode (corresponding to $I_R$ component), the driving current of the laser element must be set within the range of 0 to 80 mA in order to obtain a pulse output of 3 mW, since the maximum driving current of about 80 mA including compensation of output decrease due to temperature rise must be necessary. When the D/A converter 8 has 8 bit length and two digits are allotted as a precision (resolution) by taking the dead zone of the window comparator 4 into consideration, the resolution (precision) for the driving current setting range becomes 0.6 mA of current value so that precision in light power control becomes 0.2 mW in the case of the laser element having the differential quantum efficiency $\eta$ of 0.3 mW/mA. That is, only precision of about 7% can be obtained for the maximum power of 3 mW so that such a laser element can not be utilized to the application requring high precision.

SUMMARY OF THE INVENTION

It is an object of the present invention to eliminate the above described disadvantages of the conventional optical power stabilizing device.

It is another object of the present invention to provide an optical power stabilizing device for generating a stabilized light output power by controlling to the desired value, quantity of the light power from a light source having a non-linear light power characteristic to a driving current (voltage).

According to the present invention there is provided an optical power stabilizing device comprising a light source for generating a light output having a non-linear characteristic to a driving current or voltage thereof, a light detection circuit coupled to the light source for detecting a part of the output light to generate an electric signal, a signal treating circuit connected to the light detection circuit for treating the detected electric signal, a compensation circuit connected to the signal treating circuit for compensating the current or voltage to be supplied to the light source in accordance with the temperature variation, and a control circuit connected to the signal treating circuit and the compensation circuit for controlling the current or voltage to be supplied to the light source.

The present invention is based on the fact that in view of the disadvantage of the conventional optical power stabilizing device, a knee point (for example, radiation threshold in the semiconductor laser element) of the light power characteristic curve to the driving current (voltage) of a light source having the non-linear light power characteristic can be changed with a certain relation in accordance with the temperature change.

BRIEF DESCRIPTION OF THE DRAWING

FIG. 2 is a circuit diagram showing the conventional optical power stabilizing device;

FIG. 3 is a circuit diagram showing one embodiment of an optical power stabilizing device according to the present invention; and FIG. 4 is a circuit diagram showing the other embodiment of the optical power stabilizing device according to the present invention.

DESCRIPTION OF THE PREFERRED EMBODIMENT

Figure 1:
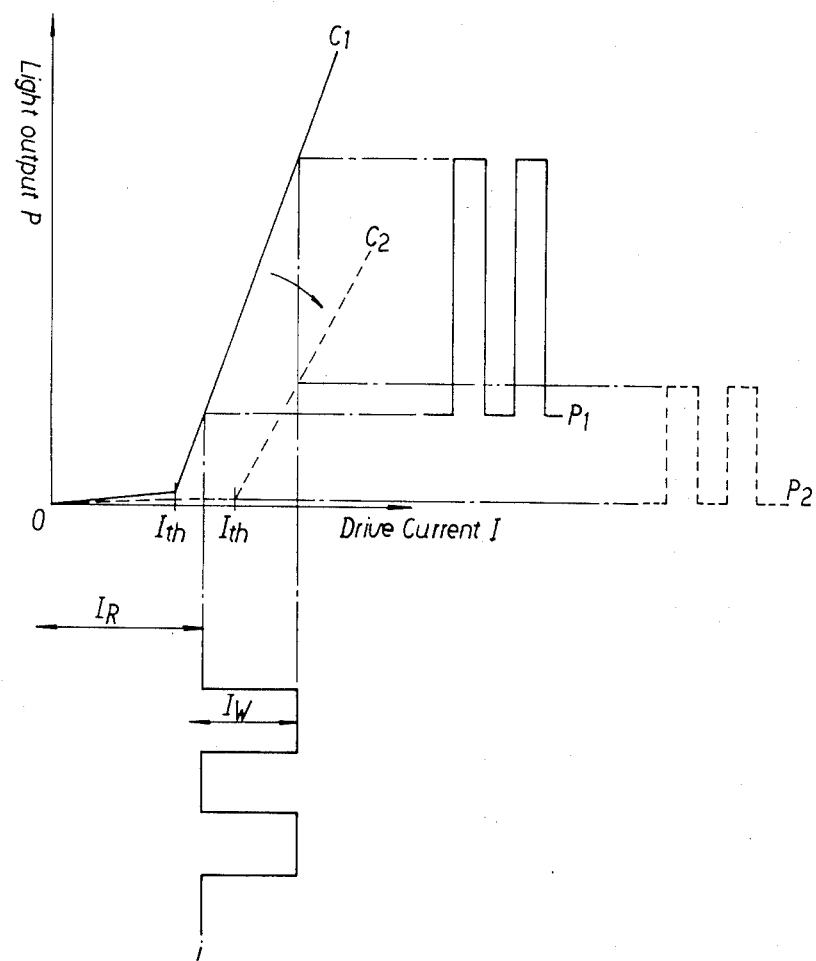
FIG. 1 is a diagrammatic view showing a light power characteristic of a light source having non-linear power, such as a semiconductor laser element.

Referring now to the drawing, wherein like reference characters designate like or corresponding parts through out the several views, there is shown an optical output or power stabilizing device according to the present invention.

It is well known that a threshold current $I_{th}$ of a semiconductor laser element is changed in accordance with ambient temperature as shown in following equation (1).

$$I_{th} \propto \exp (T/T_0) \tag{1}$$

where T is an ambient temperature (K.). Provided that an adjustable range of the threshold current capable of following to temperature change is set from 260 K.(13° C.) to 330 K.(57° C.) and the threshold current is 60 mA at 300 K.(27° C.). It is found that the adjustable range of threshold current corresponding to the temperature change may be 52 to 70 mA. According to the present invention, a current of about 50 mA flows through the semiconductor laser element, previously, a compensating signal in accordance with temperature change is supplied to the drive circuit of the laser element, thereby automatically compensating the driving current for the laser element, and the component which is not adjusted by the above temperature compensation, is subjected to a feedback control by supplying additional signal obtained by the detection of light power, thereby providing highly precise light power stabilizing device.

FIG. 3 shows one embodiment of an optical power stabilizing device according to the present invention. In the present embodiment, a major part of the device is the same as that of the device shown in FIG. 2 except that there is provided between the D/A converter 8 and the operational amplifier 10 an adjusting or compensation means 9 for adjusting the shift component caused by temperature change, so that the construction and function of the major part are omitted.

The adjusting means 9 comprises a constant-voltage regulated power supply 91, a resistor 92 connected to the power supply 91, an operational amplifier 94 connected to the resistor 92, a resistor 93 serving as a thermo sensor having large temperature coefficient, which constitute a feedback circuit for the operational amplifier 94, and a resistor 95 connected between the amplifier 94 and the invented input of the operational amplifier 10.

Provided that the resistor 93 having large positive temperature coefficient with respect to the temperature change has a resistance value R at ambient temperature T=300 K.(27° C.) and a resistance temperature coefficient $\alpha$. Generally, the resistance value $R_{93}$ of the resistor 93 at a temperature $T_1$ is shown by following equation (2).

$$R_{93} = R[1 + \alpha(T - 300)] \tag{2}$$

If the resistance value of the resistor 92 is $R_{92}$ and the voltage of the power supply 91 is E, the output $E_1$ of the operational amplifier 94 is shown by following equation (3).

$$E_1 = -\frac{R_{93}}{R_{92}} \cdot E = -\frac{R}{R_{92}}[1 + \alpha(T-300)]E \tag{3}$$

If the resistance value of the resistor 95 is $R_{95}$ and the resistance value of the resistor 11 is $R_{11}$, a current component $I_1$ of the current flowing through the resistor 12 depending on the adjusting means 9 may be shown by following equation (4).

$$I_1 = \frac{1}{R_{12}} \cdot \frac{R_{11}}{R_{95}} \cdot \frac{R}{R_{92}}[1 + \alpha(T-300)]E \tag{4}$$

If the current component $I_1$ caused by the adjusting means 9 is 50 mA, the resistance value of the resistor 12 is 1$\Omega$, $R_{11}/R_{95}=1$, $\alpha=5\times10^{-3}\deg^{-1}$, and E=5V, $R_{93}/R_{92}$ becomes $12\times10^{-3}$. When $R_{93}=1k\Omega$, for example, $R_{92}$ becomes 82.5K$\Omega$. In this case, the equation (4) may be shown by following equation (5).

$$I_1 = 0.3 \times (T-100) \text{ (mA)} \tag{5}$$

$I_{th}(T)$ may be found as follows by substituting T=260k, $I_{th}$=50 mA for the equation (1).

$$I_{th}(T) = I_0 \cdot \exp(T/200) = 13.6 \cdot \exp(T/200)$$

The current I required to oscillate the semiconductor laser element 1 with 3 mW can be found by following equation (6).

$$I = (P/\eta) = 10 \text{ (P:output)}$$

$$I = I_{th}(T) + I = 13.6 \cdot \exp(T/200) = 10 \tag{6}$$

Therefore, the condition $I > I_1$ is satisfied at the range of ambient temperature, 260 K.$\leq T \leq$ 330 K., so that the magnitude of current to be compensated by the D/A converter (di=I−$I_1$) becomes maximum at ambient temperature T=330 K.(57° C.), that is, di<11 mA. Even if large allowance is set and di is a maximum 20 mA, the current per 1 digit of the D/A converter having 8 bit length becomes 0.078 mA so that precision of corresponding light quatity becomes 1.5% for 0.023 mW.

FIG. 4 shows another embodiment of the device according to the present invention. In this embodiment a feedback loop for treating analog signal is substituted for the feedback loop for treating digital light detected signal as shown in FIG. 3. The other construction of the device is the same as that of the device shown in FIG. 3 so that its explanation is omitted. The analog signal treatment is performed by only a resistor 14 so that the circuit construction becomes very simple.

It is further understood by those skilled in the art that the foregoing description is a preferred embodiment of the disclosed device and that various changes and modifications may be made in the invention without departing from the spirit and scope thereof.

For example, the adjusting or compensation means may be a thermistor or a thermocouple instead of the resistor having positive temperature coefficient.

What is claimed is:

1. An optical output stabilizing device comprising a light source for generating a light output having a non-linear characteristic with respect to a driving current or voltage thereof, a light detection circuit coupled to the light source for detecting a part of the output light thereof to generate an electric signal, signal treating circuit means connected to said light detection circuit for treating the output electric signal thereof, compensation circuit means connected to said signal treating circuit means for compensating the driving current or voltage to be supplied to the light source in accordance with a temperature variation of the light source, and control circuit means connected to said signal treating circuit means and said compensation circuit means for controlling the driving current or voltage to be supplied to the light source.

2. An optical output stabilizing device as claimed in claim 1, wherein said signal treating circuit means is a digital signal treating circuit.

3. An optical output stabilizing device as claimed in claim 2, wherein the digital signal treating circuit comprises a window comparator connected to the light detection circuit for generating an output signal having an inverted polarity, an AND gate having a first input connected to the window comparator and a second input connected to a clock pulse generator, a digital up/down counter connected to the AND gate for counting the outputs of the AND gate, and a digital to analog converter connected to the up/down counter for converting the digital contents of the counter into an analog signal.

4. An optical output stabilizing device as claimed in claim 1, wherein said compensation circuit means comprises an operational amplifier having an output connected to the output of said signal treating circuit means, a non-inverted input connected to a grounded point and an inverted input connected to a biasing means, and thermo sensing resister means connected between the output and the inverted input of the operational amplifier.

5. In an optical output stabilizing device comprising a light source for generating a light output having a non-linear characteristic to a driving current or voltage thereof, a light detection circuit coupled to said light source for detecting a part of said light output to generate an electric signal, window comparator means having an input connected through an amplifier to said light detection circuit, and AND gate circuit means having a first input connected to an output of said window comparator means, clock pulse generator means connected to a second input of said AND gate circuit means, up/down counter means connected to output means of said AND gate circuit means, digital/analog converter means having an input connected with an output of said up/down counter means, an input for said light source comprising a resistor and transistor connected in series, a first operational amplifier connected between an output of said digital analog converter means and a base of said transistor and a feedback resistor connected between an output of said digital analog converter means and a point between said resistor and transistor in said input for said light source, the improvement comprising adjusting means connected with an output of said digital/analog converter means, said adjusting means consisting essentially of constant voltage regulated power supply means having a terminal connected to ground, a second operational amplifier having a first input connected through resistor means with said constant-voltage regulated power supply means and a second input connected to ground, thermo-sensor means connected between said first input of said second operational amplifier and an output of said second operational amplifier and resistance means connecting said output of said second operational amplifier and said output of said digital/analog converter means.

6. An optical output stabilizing device according to claim 5, in which said thermo-sensor means is a resistor having a large temperature coefficient.

* * * * *